United States Patent [19]
Petry, III et al.

[11] Patent Number: 5,642,158
[45] Date of Patent: Jun. 24, 1997

[54] METHOD AND APPARATUS TO DETECT CAPILLARY INDENTATIONS

[75] Inventors: John P. Petry, III, West Newton; David J. Michael, Newton; Arman Garakani, Cambridge, all of Mass.

[73] Assignee: Cognex Corporation, Natick, Mass.

[21] Appl. No.: 236,212

[22] Filed: May 2, 1994

[51] Int. Cl.⁶ ........................................ H04N 7/18
[52] U.S. Cl. ........................ 348/87; 348/126; 382/146
[58] Field of Search .................... 382/8, 146; 348/87, 348/126; H04N 7/18

[56] References Cited

U.S. PATENT DOCUMENTS

| | | |
|---|---|---|
| 4,240,750 | 12/1980 | Kurtz et al. . |
| 4,347,964 | 9/1982 | Takasugi et al. . |
| 4,421,410 | 12/1983 | Karasahi et al. . |
| 4,439,010 | 3/1984 | Doty . |
| 4,441,248 | 4/1984 | Sherman et al. . |
| 4,799,175 | 1/1989 | Sano et al. . |
| 4,855,928 | 8/1989 | Yamanaka . |
| 5,138,180 | 8/1992 | Yamanaka . |
| 5,156,319 | 10/1992 | Shibasaka et al. . |
| 5,170,062 | 12/1992 | Miyahara . |
| 5,204,910 | 4/1993 | Lebeau ............... 348/126 |
| 5,225,891 | 7/1993 | Choumei . |
| 5,396,334 | 3/1995 | Sugawara ............... 348/126 |

*Primary Examiner*—Howard W. Britton
*Attorney, Agent, or Firm*—Maureen Stretch

[57] ABSTRACT

This invention provides a method and apparatus for automatically inspecting the connection of a wire to a lead on lead frame containing a semiconductor chip or similar device. Using an image processor to locate the general position of a soldered lead in a digitized image, the present invention creates a template of an idealized optical indentation left by a good bond; determines parameters such as wire angle, idealized position and shape thresholds for applying the template; conducts a normalized correlation search of the digitized image; compares the results returned to the parameters and reports the resulting signals generated by this comparison to a host controller or other control module.

2 Claims, 13 Drawing Sheets

METHOD AND APPARATUS TO DETECT CAPILLARY INDENTATIONS

BACKGROUND OF THE INVENTION

A. Field of the Invention

This invention relates generally to machine vision systems and semiconductor chip wire bonding devices, and similar bonding apparatus, and particularly to a method and apparatus for locating and inspecting the bond formed on a lead on a semiconductor chip.

B. Background

Semiconductor devices, such as integrated circuit chips, are electrically connected to leads on a lead frame by a process known as wire bonding. The wire bonding operation involves placing and connecting a wire to electrically connect a pad residing on a die (semiconductor chip) to a lead in a lead frame. Once all the pads and leads on the chip and lead frame have been wire bonded, it can be packaged, often in ceramic or plastic, to form an integrated circuit device. In a typical application, a die or chip may have hundreds or thousands of pads and leads that need to be connected.

There are many types of wire bonding equipment. Some use thermal bonding, some use ultra-sonic bonding and some use a combination of both. A post-process inspection step, commonly called the third optical inspection, typically involves locating and inspecting the position and size of all bonds on the device, the wire connections and the wire heights using optical means to insure that a good connection was created by the bond. This is done after wire bonding is complete and before encapsulation of the integrated circuit.

Heretofore the third optical inspection has been accomplished only after the device is completely bonded and sent to a separate machine or operator, but most usually by a human operator using a microscope. The inspection is often done on a sampled basis. While sampling reduces the number of inspections, bad connections may be missed.

Vision systems or image processing systems (systems that capture images, digitize them and use a computer to perform image analysis) are used on wirebonding machines to align devices and guide the machine for correct bonding placement, but have heretofore not been used during the process for inspection purposes. Separate machines are available to perform inspections outside of and after the bonding process, but this requires another piece of capital equipment in the production line.

Offline machines tend to be slow and may not be as accurate as an in process inspection, since significant information about the device is not available to an offline system. As a result, defective bonds may not be detected until later in the assembly process or after its completion. Productivity is thus lowered, and some defective bonds may not be detected at all.

In actual application in the field, almost all wirebond inspections are done manually. Manual inspection is very slow. Expensive parts may need to be inspected 100% on an individual basis, rather than sampled, and if this is done manually as well, this can further reduce productivity and add to costs.

In order to perform an automated, in-process inspection of the leads bonded by the wire bonder, a system must first locate each soldered lead formed on a chip before an inspection can take place. Applicants' co-pending U.S. applications:

Automated Optical Inspection Apparatus, filed Oct. 6, 1993, Ser. No. 08/132,532; and continuation in part thereof, Automated Optical Inspection Apparatus Using Nearest Neighbor Interpolation, Ser. No. 08/236, 215, filed May 2, 1994; which are hereby incorporated by reference, describe a system for locating the nominal placement of a bonded lead with sufficient speed and accuracy to permit an inspection of lead size and position to occur.

Even when the nominal location of a soldered lead can be found quickly, however, one of the major problems with trying to locate and measure bonds on leads in an image are the large number of confusing edges that are present. These are due to the circuitry, probe marks and bond pad or multiple leads & wires in the image. Most semiconductor chips have a considerable amount of visual detail (such as the images of the circuits themselves) which must be circumvented in analyzing the post-bond image to find the bonded lead. In post-process inspections, some of this detail can be mistaken for parts of the bonds. Visual imperfections on the pads caused by probe marks, discoloration, or imperfect illumination further complicate these difficulties.

Wire bonding mechanisms that use a capillary means to affix the wire from the contact pad to the lead on the lead frame usually leave a circular or elliptical indentation at the point where the bond head strikes the lead. This indentation is roughly the diameter of the capillary which forms the end of the bond head and often in the shape of a ring. The formation of the ring is affected by the angle of the wire connecting the die to the lead, the force used in making the bond, the frequency at which the capillary is vibrated, and other factors controlled by the bonding device. While an entire ring is often seen, it is also common for only an arc shaped part of it to appear. In addition, part of the bond known as the crescent, or stitch, sometimes extends into the ring as side effect of the bonding process. This stitch intrusion may obscure a significant portion of the ring or arc indentation.

To bond the wire to the lead, the bond head using the capillary is vibrated at extremely high speed. As it moves on the lead, the indentation is formed. An inner diameter smaller than the chamfer diameter and an outer diameter larger than it appear. Their size depends primarily on the bond head frequency, the shape of the capillary, and the force used in bonding.

The indentation's reflective properties are not always consistent across the indentation. In practice there may be a fringe area immediately beyond the inner and outer diameters where the image intensity decreases (or increases, depending on the light/dark polarity of the image) until it attains the intensity of the lead.

Other problems can be created by mispositioning of the bond head or improper bond force.

If the indentation can be found and measured, its presence, placement, and size indicate the quality of the connection formed on the lead. However, the visual complexity and variability surrounding the lead makes it difficult to automate this inspection, either during an in process operation or as an post-process, offline inspection.

SUMMARY

The present invention locates a bonded lead on a lead frame and measures its quality. In a preferred embodiment, video images of one or more representative indentations created by a bond head are analyzed in an offline setup or training step to create optimum parameters for an idealized model. These parameters, which include radii, polarity, starting and ending angles, and stitch intrusion dimensions, are used to create a synthetic image of an idealized indentation. During the bonding assembly process, digitized images of a bonded lead are acquired and the general location of the lead is found using Applicants' co-pending U.S. applications mentioned above. The present invention uses the appropriate idealized model to conduct a normalized correlation search of the image to locate the indentation left by the bond head. Once the location of a bonded lead has been found, it is evaluated to determine whether its location is within user specified distances of its ideal location, and whether its correlation to the idealized model shape is sufficiently high enough to indicate that lead has been acceptably bonded.

It is an object of this invention to locate and measure, through digitized images, the indentation left by a bonding mechanism on a semiconductor lead to indicate the quality of the connection formed by the bonding mechanism so that decisions can be made about the part's acceptability online, as part of the bonding process. For example, information obtained by the present invention can be signaled to other modules to initiate rejecting a part or adjusting the wire bonding, either through an automatic feedback loop or through manual adjustments communicated by the system to the operator.

In a preferred embodiment, it is a feature of the present invention that it forms part of an in process inspection of a wire bonding operation, and can thus significantly improve the throughput and accuracy of the inspection process.

In another aspect, the present invention permits accurate measurement of the connection formed, despite the presence of a stitch intrusion.

Yet another aspect of the present invention is that it can also be combined with a post process, offline inspection machine or system.

It is yet another aspect of the present invention that it is an automated apparatus that works significantly faster and more accurately than manual inspections.

DETAILED DESCRIPTION OF THE INVENTION

Figure 1:
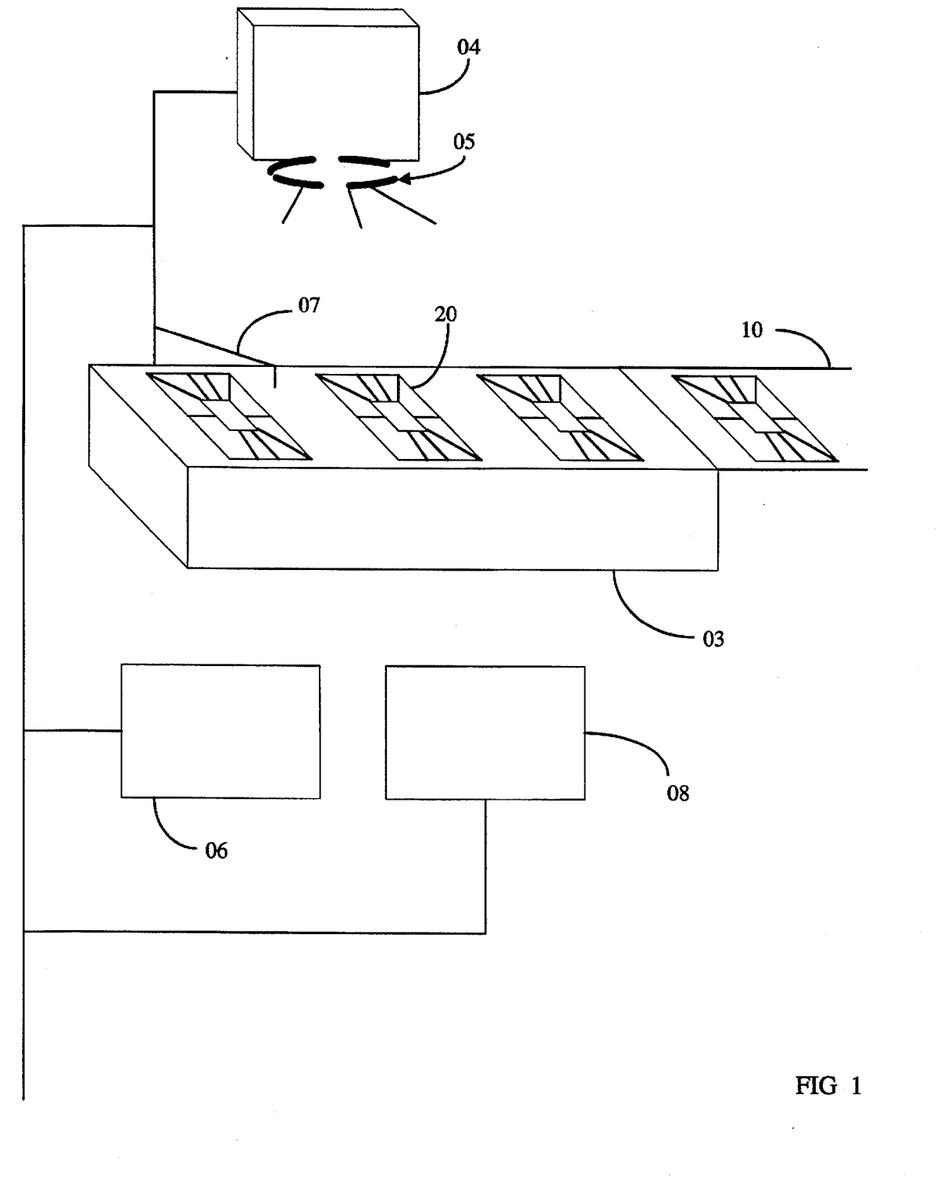
FIG. 1 is an illustration of a system incorporating the present invention.

In FIG. 1, a system incorporating the present invention is shown. The system includes a wire bonding machine 01 having a movable platform 03 such as an X-Y table for holding semiconductor chips 20 situated in a lead frame 10; a video camera 04 or other optical sensing device for generating images, which camera is typically positioned over the target chip 20 and lead frame 10 to be bonded; illumination means 05 for illuminating the chip in a lead frame; an image processor 06, capable of digitizing and analyzing the optically sensed images; bonding mechanism 07; and host controller 08 electronically connected to the bonding mechanism 07, the movable platform 03, the camera 04, and the image processor 06.

Figure 2:
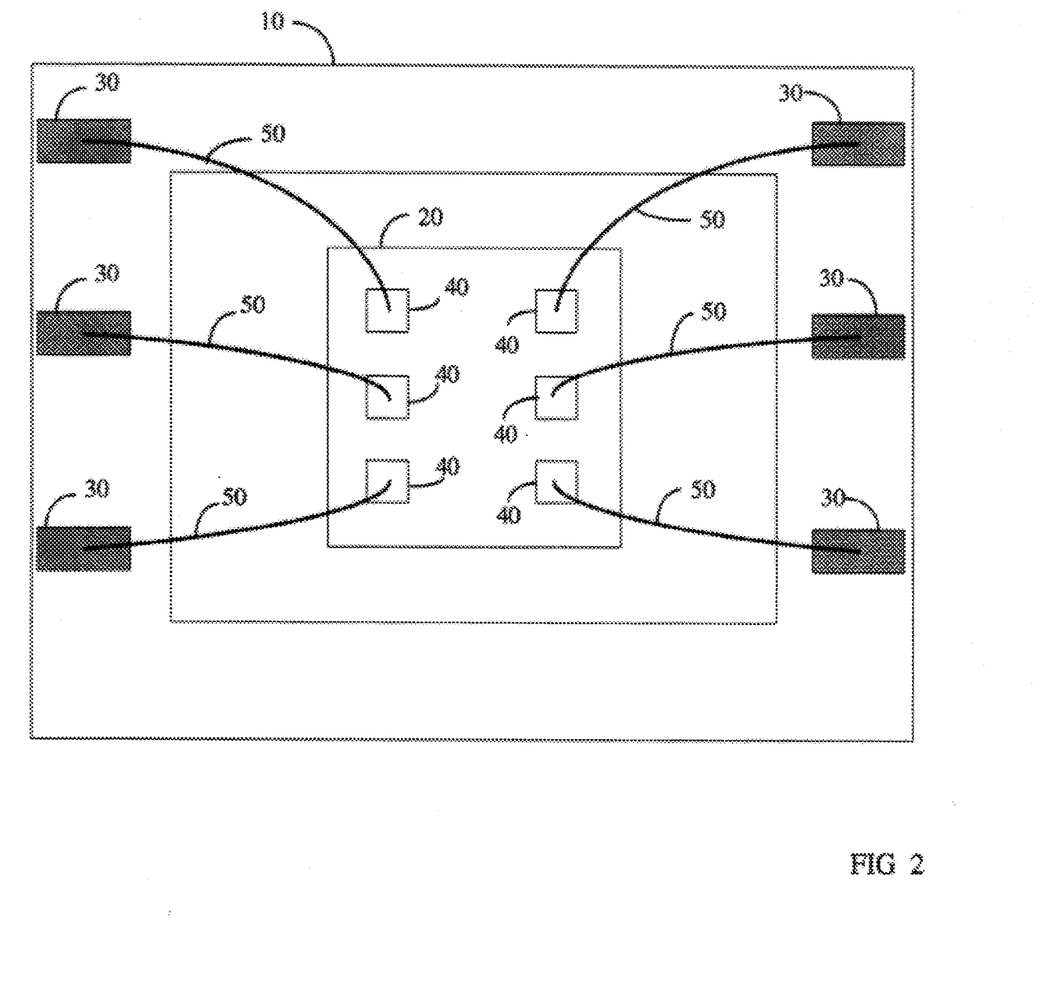
FIG. 2 is a diagrammatic view, taken from above, of a semiconductor chip or die in a lead frame.

FIG. 2 depicts a semiconductor chip 20, in a lead frame 10, having pads 40, and leads 30. The wire bonding process bonds a conductive wire between each pad on the chip 20 and its respective lead 30 on lead frame 10.

Figure 3:
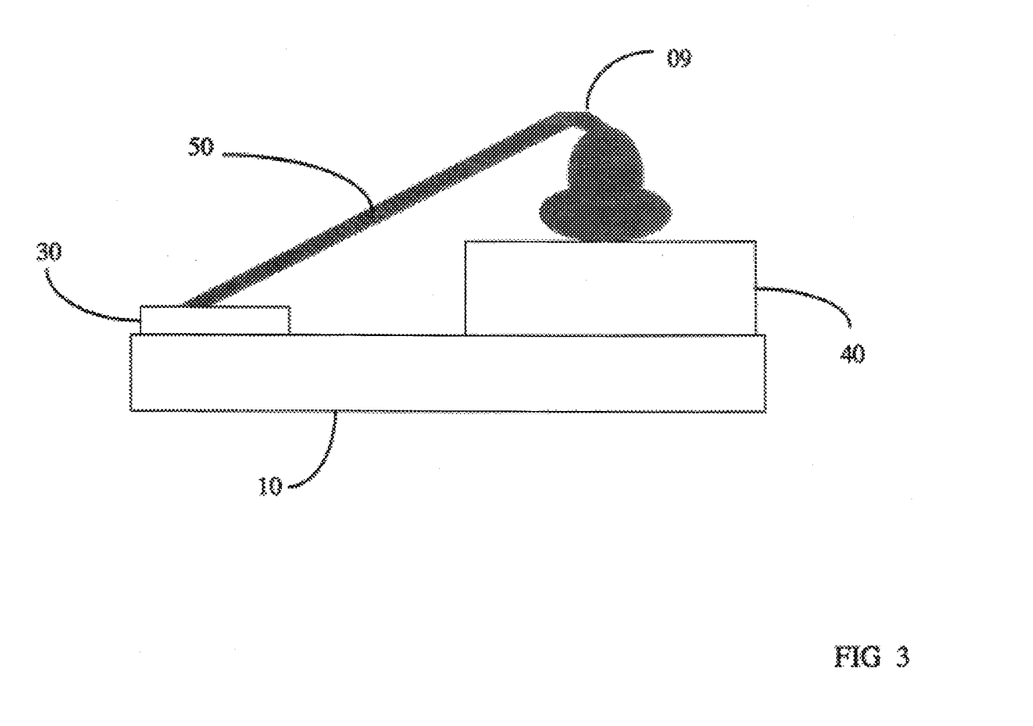
FIG. 3 shows a side view of a bond formed on a pad connected to a lead on a lead frame.

FIG. 3 shows a side view of a bond 09, connecting a pad 40, to a lead 30, on a lead frame 10 by a wire 50. In a typical wire bonding device, a wire 50 or filament is extruded by the bonder and deposited on the die pad and extended to the lead frame, where the wire is also affixed, to form an electrical connection.

Figure 4:
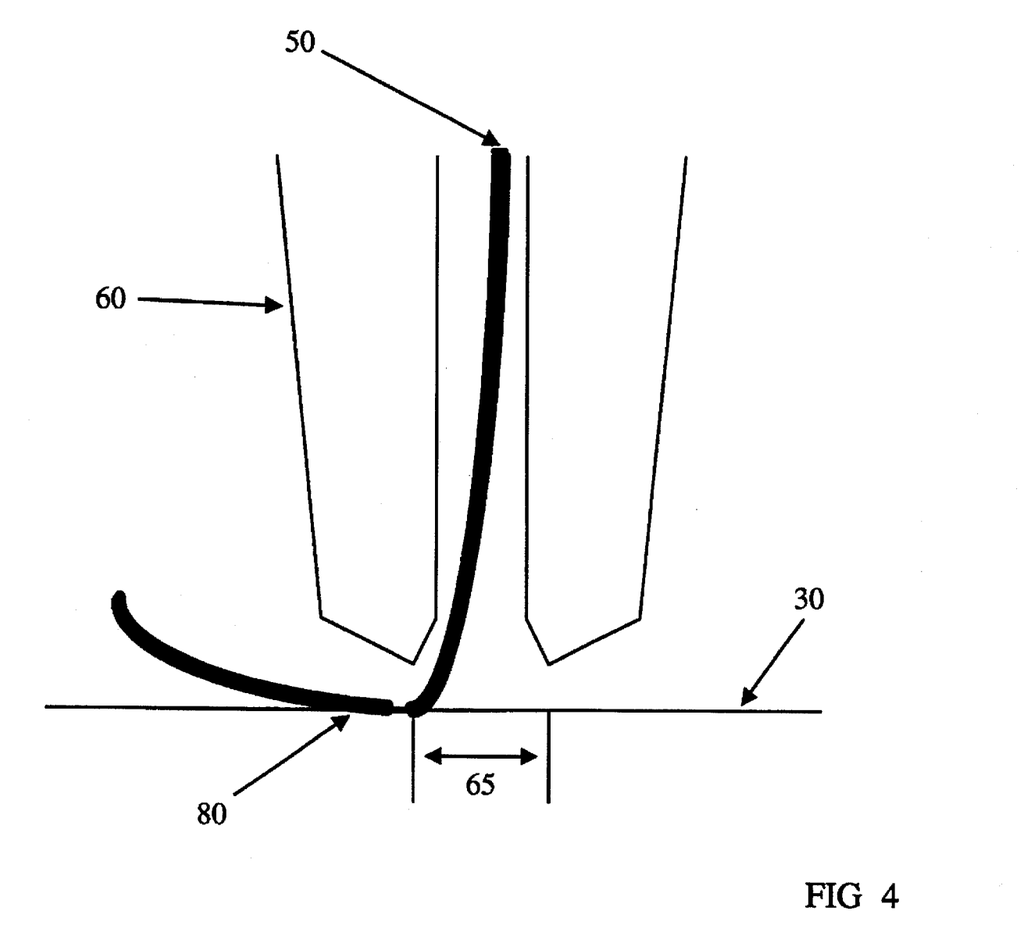
FIG. 4 shows a capillary style bond head of a bonding mechanism.

FIG. 4 shows a side view of a typical capillary style bonding mechanism 07. As can be seen, wire 50 is pulled through bonding mechanism 07, through a capillary 60. A portion of wire 50 extends past the chamfer diameter area and forms what is known as a stitch 80 or crescent, on lead frame 30.

Figure 5A:
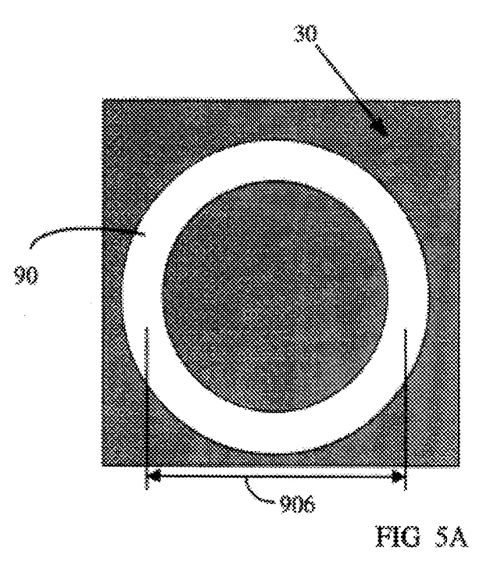
FIG. 5 shows a top view of grey level images of a ring indentation left by a bond head, and an arc indentation left by a bond head.
Figure 5B:
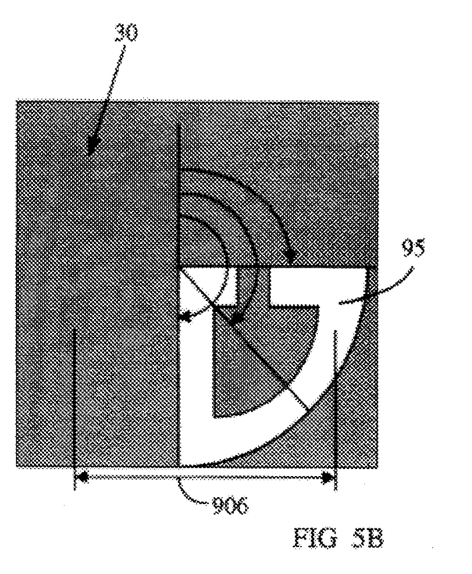

In FIG. 5 a top view is shown of two types of indentation left by bonding mechanism 07. In FIG. 5a, a whole ring indentation 90, on a lead 30, is shown, having an outer diameter 90b, that usually corresponds to the outer diameter of chamfer diameter 65, of bonding mechanism 07. FIG. 5b is a top view of a partial ring 95, having an arc shape. While whole ring indentation 90 is often seen, it is also common for only an arc, or partial ring 95, as shown in FIG. 5b to appear. When only an arc or partial ring 95, is created, it is usually aligned symmetrically with the wire angle, the angle between the die and the lead being bonded. That is, wire angle=starting angle+theta and wire angle=ending angle−theta where theta is a function of the bonder force. When the entire ring is visible:

starting angle=ending angle, and theta=180 degrees.

Figure 10:
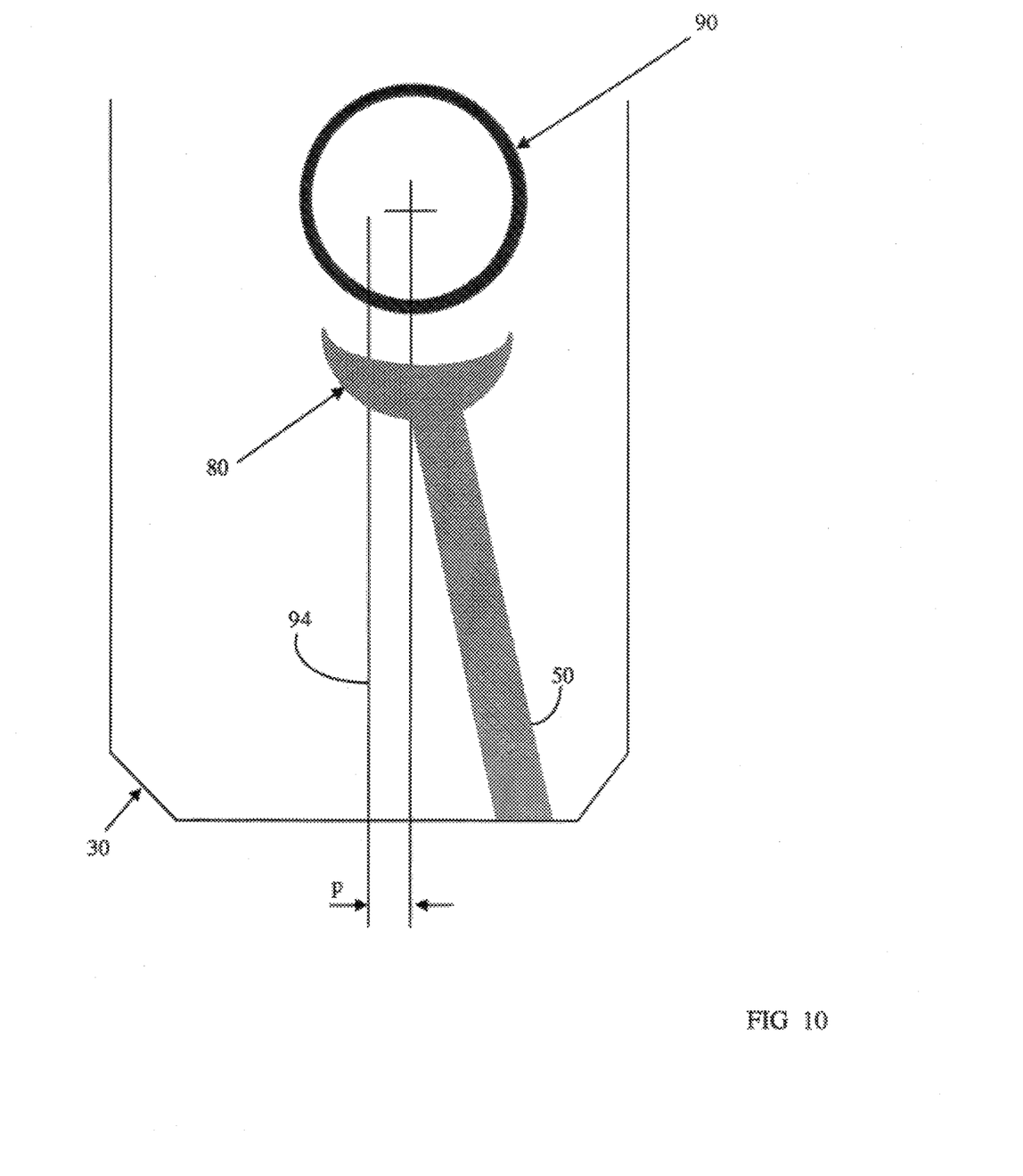
FIG. 10 is an illustrative top view of a ring left by a bond head.

Turning to FIG. 10, a top view of a digitized image of a bonded lead 30, having a stitch 80 or crescent, is depicted in a whole ring indentation 90. Shown here, lead centerline 94 represents the ideal location for the placement of the bond on the lead.

Figure 10A:
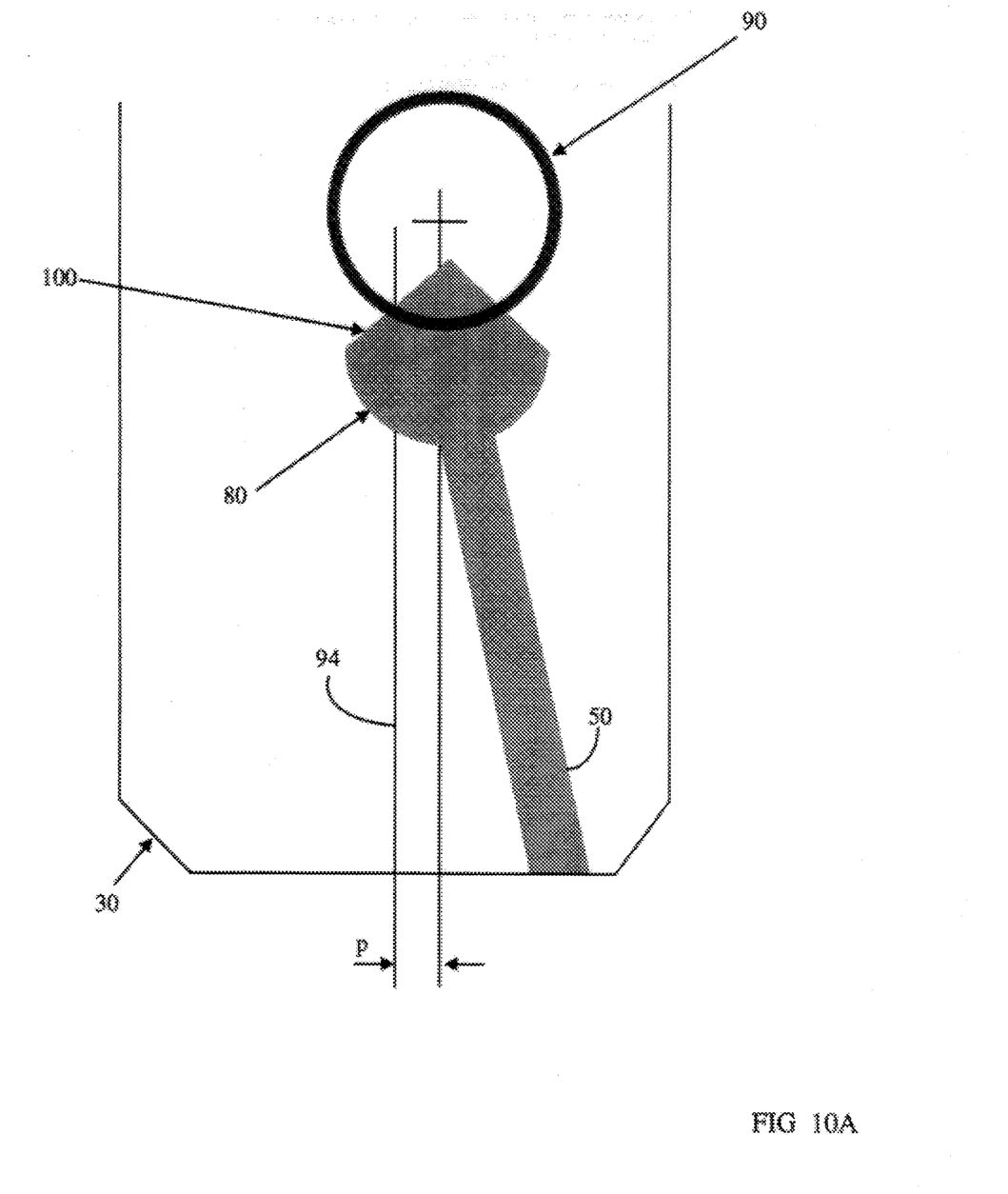
FIG. 10a is an illustrative top view of a ring left by a bond head in which a stitch intrusion is present.

Next, in FIG. 10a, the same image is shown having a stitch 80 or crescent, that intrudes into the whole ring indentation, forming intrusion 100. Part of stitch 80 forms a part of the portion of the wire which is electrically connected to the lead. Often it only appears outside of an indentation, and is therefore not a consideration in creating a correlation template. But in many cases, and sometimes the majority of cases, it does intrude into the indentation region. When this happens, it usually occludes roughly ¼ of the center of the indentation, symmetric about the wire angle. It can also extend beyond the indentation, but usually does not obscure the indentation itself.

Figure 8:
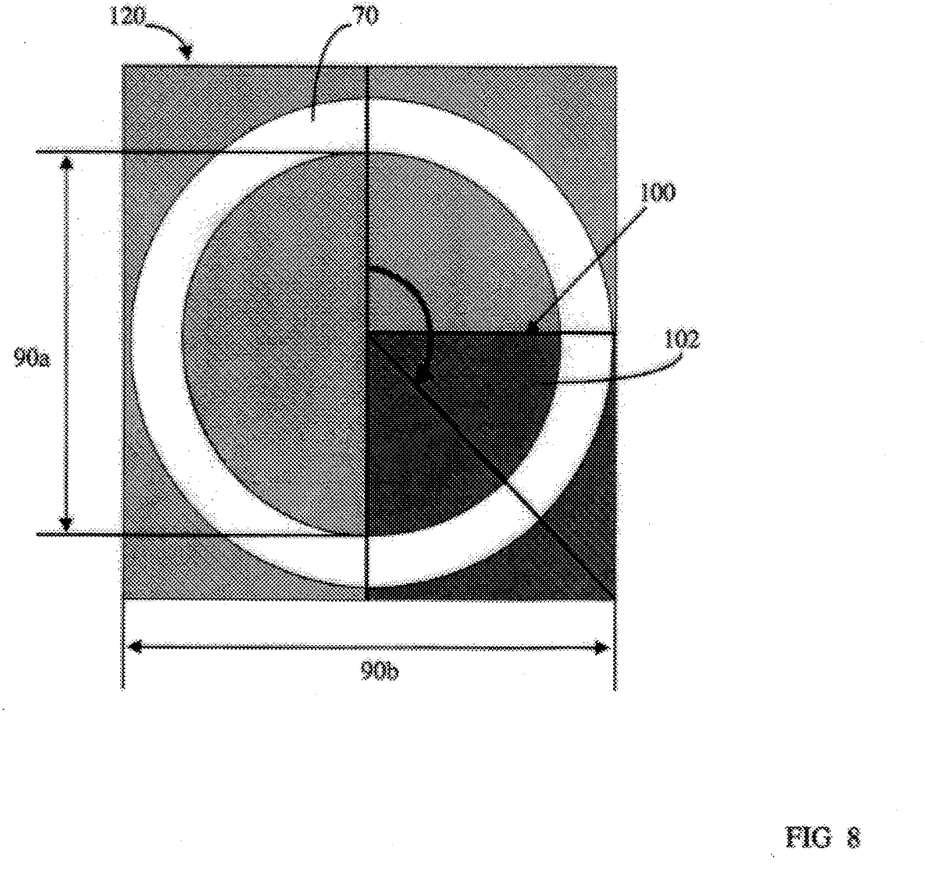
FIG. 8 shows a preferred embodiment of a correlation template ring with a crescent intrusion according to the present invention.
Figure 9:
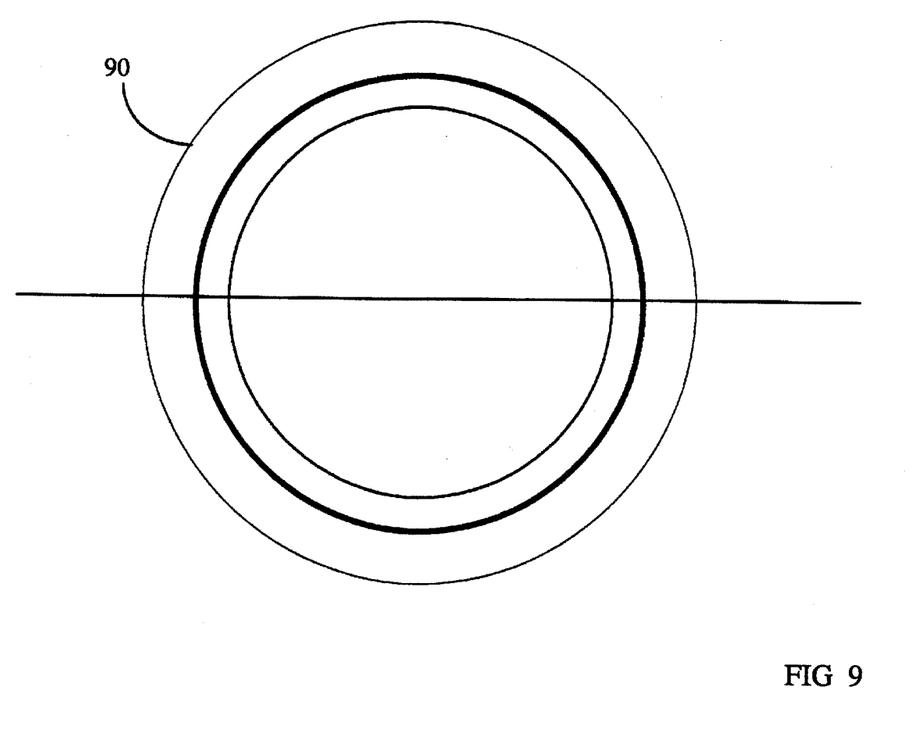
FIG. 9 is a top view of a model according to the method and apparatus of the present invention.

FIG. 8 depicts a correlation template image 120 used in a preferred embodiment of the present invention. In this light polarity grey level template image 120, intrusion 100, is represented by the darkest area of the template 120, and disposed symmetrically about wire angle 102. Whole ring indentation 90 is shown with an inner diameter 90a, and an outer diameter 90b.

In a preferred embodiment, the models shown in FIG. 8 are created by taking a number of images of the type of part to be inspected, and building a model based on statistical averaging. The model can be either an image that represents the statistical average, or the results of the averaging can be used to derive a synthetic model from the images. A synthetic model in this embodiment is a pixel image created by software graphic routines that create grey level models of circles, rectangles, and so on. In a preferred embodiment, the part samples used for this averaging process are physically marked to improve location of the part in the images created for averaging purposes. Thus, models created according to this method are more likely to represent a good part.

A model created for a whole ring indentation according to a preferred embodiment can also be used for an arc or partial ring 95 indentation such as that shown FIG. 5. In this latter instance, the portions of the model that are to be ignored in the search are filled with a pixel value that so indicates to a normalized correlation search. In a preferred embodiment, these are referred to as "don't care" pixels. Masks or other means could also be use to modify a whole ring indentation to an arc.

Figure 6:
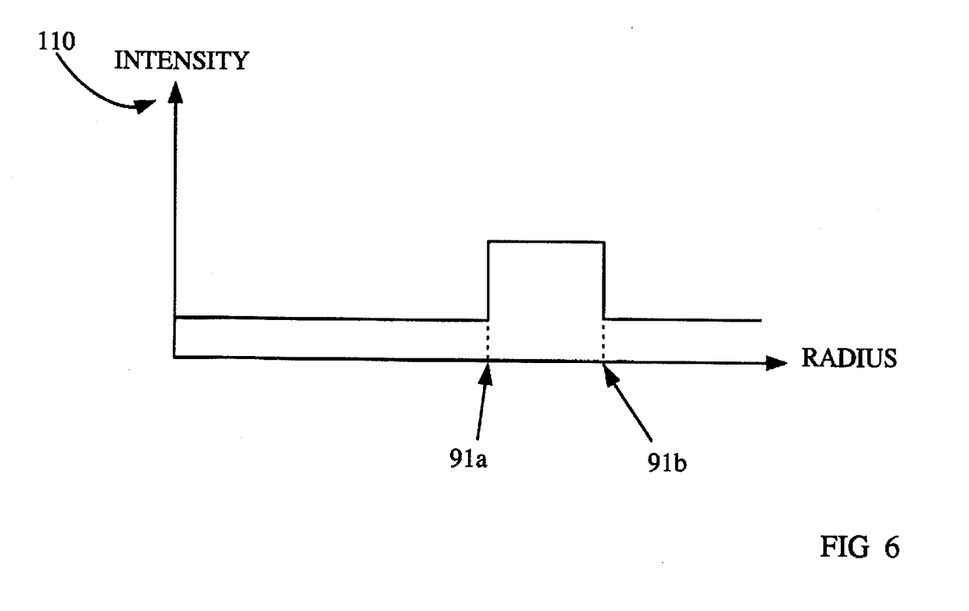
FIG. 6 shows an illustrative schematic view of a flat correlation template profile.

Turning to FIG. 6, a graphed plot depicting a flat correlation template profile is shown. To bond the wire to the indentation, the capillary is vibrated at extremely high speed. As it moves on the lead, the indentation is formed. As shown in FIG. 6, an inner radius 91a, smaller than the radius of chamfer diameter 65, (depicted in FIG. 4) and an outer radius 91b, larger than that of chamfer diameter 65, appear. Their size depends primarily on the bond head frequency and the force used in bonding.

The indentation's reflective properties are not always consistent across the indentation. In practice there may be a fringe area immediately beyond inner radius 91a and outer radius 91b, where the image intensity decreases or increases, depending on the polarity, until it attains the intensity of the lead.

Figure 7:
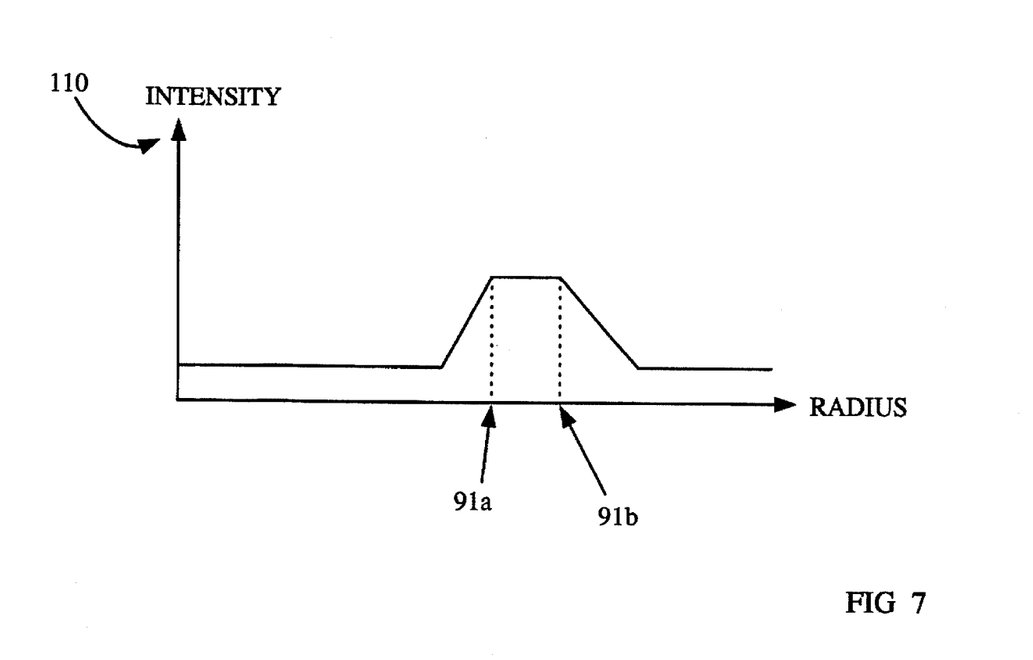
FIG. 7 depicts an illustrative schematic view of a modified sawtooth correlation template profile.

FIG. 7 shows a graphical representation of a modified sawtooth correlation template profile used in a preferred embodiment to model this fringing or variation in image intensity. Depending on the illumination used on the actual part being inspected, the intensity axis 110 of the profiles shown in FIGS. 6 and 7 may be reversed. That is, the indentation may appear as a black ring or arc on a grey background or as a white ring on a grey background.

Figure 13:
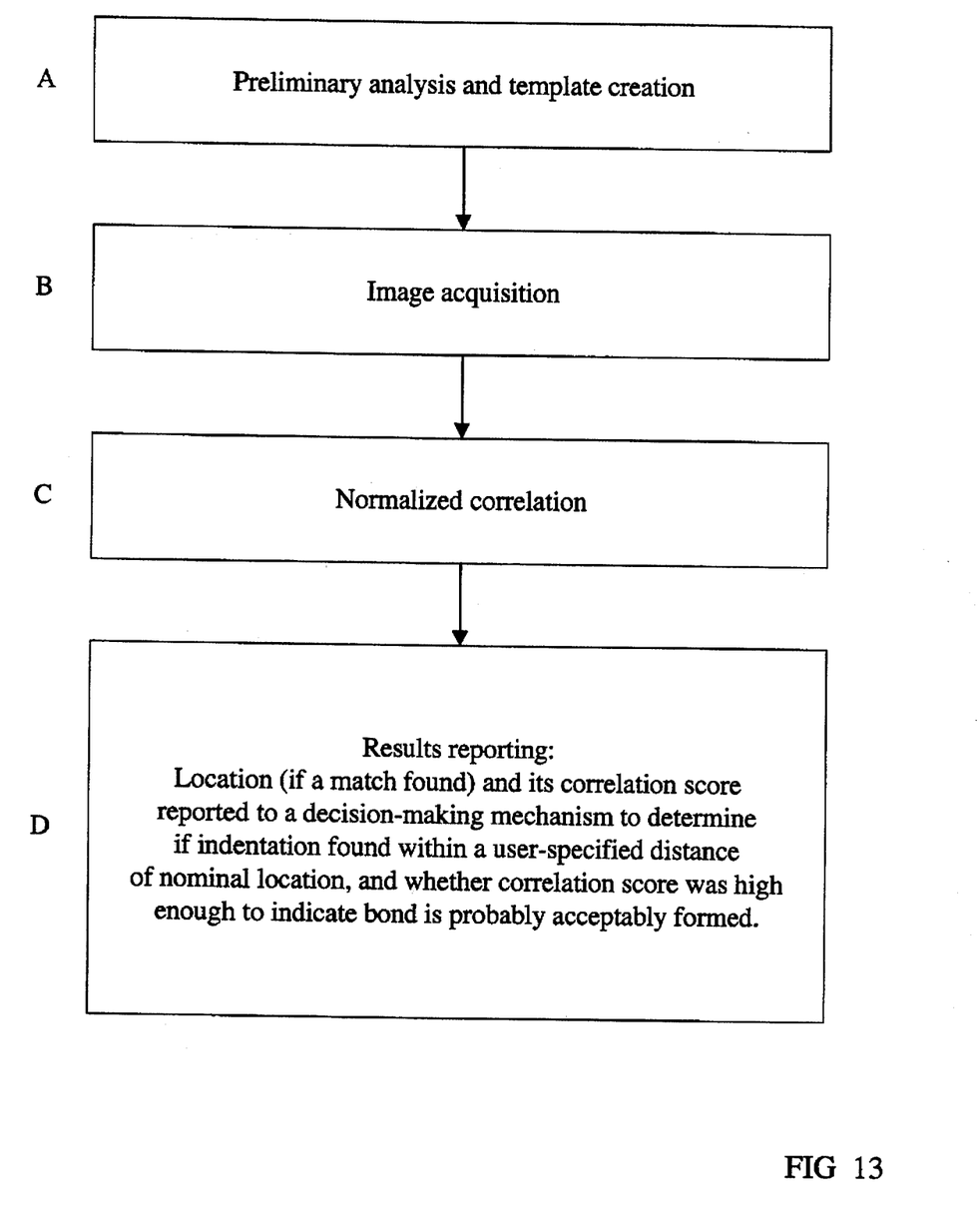
FIG. 13 is a diagram showing the principal operations of the present invention.

Turning now to FIG. 13, the principal steps of the invention are depicted. At Step A, preliminary analysis and template creation are done. In a preferred embodiment of the invention, part or all of this step is performed offline in a setup or training operation, although it could be done online. A digitized video image of one or more representative indentations formed by the bonding mechanism 07 in use is acquired using an image processor 06, as illustrated in FIG. 1. From one or more representative indentations, the optimum parameters for a correlation template are developed. The features of the representative images that are analyzed include radii, polarity, and starting and ending wire angles.

In a preferred embodiment, a Cognex vision processor is used to analyze these parameters to create a synthetic image of an idealized indentation. This is then passed as input or input signals to a software library routine which creates the template, using graphic routines to build images of circles, rectangles and other objects that will become part of the template. An alternative method could take several digitized video images and average them directly as input to the template-creation software.

In a preferred embodiment, the need for multiple models for either type of indentation can be eliminated through the use of Applicant's co-pending U.S. application mentioned above, to rotate the acquired image so that the portion of it which corresponds to the wire is always placed at the same angle. Other means for rotating the image could also be used. Using the above mentioned co-pending applications significant speed advantages.

In another embodiment, if only partial indentations are visible (i.e., partial rings or arcs), multiple models may be created, each corresponding to a range of wire angles. The expected wire angle is then signaled to the vision or image processor 06 by the user, and an appropriate model corresponding to it can be selected. In these instances, the acquired image is not rotated.

In a preferred embodiment, the template-creation step A is performed offline, for speed purposes. One or more templates are stored in a memory in or available to the image processor. In the case where multiple models were created, the appropriate template is selected in a later step based on the angle of the wire in the image actually being analyzed, the optical characteristics of the image, or any other parameters that have been anticipated in this step. It is possible to perform the template creation step at inspection time for in-process inspections, which may save memory, but possibly at the expense of training or setup time.

Still in FIG. 13, at Step B, an image of a bonded lead is acquired. In a preferred embodiment, at inspection time a video image is acquired, digitized and stored in a digital frame grabber and passed to an inspection routine, along with the existing template and inspection parameters established in Step A. In a preferred embodiment, the method and apparatus of the co-pending applications referenced above, are used to register pre and post bond images of the bonded lead, thus creating a difference image.

Use of the method and apparatus of these inventions improves accuracy of measurement, as blemishes, and other defects may be removed or minimized in the resulting difference image.

In a preferred embodiment, the present invention locates the wire connected to the lead being inspected in the post bond image and the difference image, and then proceeds to the next step using the difference image, which has already been rotated as described above. Alternatively, where rotation is not used, the wire angle could be computed at this step.

At Step C, in FIG. 13, normalized correlation of the model and a window of the digitized image is performed. In a preferred embodiment this is done using the difference image created and rotated by Applicant's co-pending above mentioned applications and a cone shaped search model created in Applicant's co-pending application Using Cone Shaped Search Models for Solder Ball Location, Attorney Docket Number C93-034, Ser. No. 08/236,211 filed May 2, 1994 of even date herewith, which is hereby incorporated by reference. The advantage of using the difference image is that visual confusion arising from blemishes or imperfections may have been minimized or eliminated. However, as will be apparent to one skilled in the art, normalized correlation could also be done using only the post bond image.

Normalized correlation is done at many places within the digitized image in order to determine the location of the indentation. In a preferred embodiment, a Cognex vision processor calls a pre-existing software library routine to perform this step at very high speed.

Normalized correlation is a technique used in various machine vision applications, and is well known to those skilled in the art. It takes as input a correlation template or model—that is, a representation of an ideal image—and a digitized representation of video image with which it is to be compared. In general, the digitized video image is larger than the correlation template. The output of a correlation is the location, usually in x, y coordinates in the digitized video image at which the highest correlation score is found, together with the correlation score at that point or else a not found signal.

The correlation score is a mathematical value of the similarity between the template and the video image, and is used as a measure of the quality of the feature in question. When a score is very high, the correlation score indicates a match. If the score is low, and below a specified threshold, a not found signal could be returned. In a preferred embodiment, the threshold values for correlation presented to the normalized correlation search are set so low that an image is almost always found.

In a preferred embodiment the Search software library found on a Cognex vision processor is used, but any of a number of other normalized correlation systems or programs could be used.

The digitized video image does not need to be the entire image acquired in Step B. Instead, a search window is generally created and used. A search window is a rectangular region of an image. By excluding those parts of the image beyond the probable location of the indentation or beyond a specified positional tolerance, the correlation will run much faster than if it had to examine the entire digitized video image. It will also reduce or eliminate the possibility of locating a different indentation, if more than one appears in the image.

Still in FIG. 13, at Step D, results are reported according to the method and apparatus of the present invention. In a preferred embodiment, the location of the indentation (if a match is found) and its correlation score are reported to a decision-making mechanism, where this mechanism is a software function which determines whether the indentation was found within a user-specified distance of its nominal location, and whether the correlation score was high enough to indicate that the bond is probably acceptably formed. In some applications, these and other criteria used by the decision making mechanism were specified by the user in Step A. However, they might also be specified during the inspection process itself. In the decision making module, signals can be created to be signaled to other modules (such as electronic hardware or software or possibly even mechanical devices) to initiate rejecting a part or adjusting the wire bonding, either through an automatic feedback loop or through manual adjustments communicated by the system to the operator.

Figure 11:
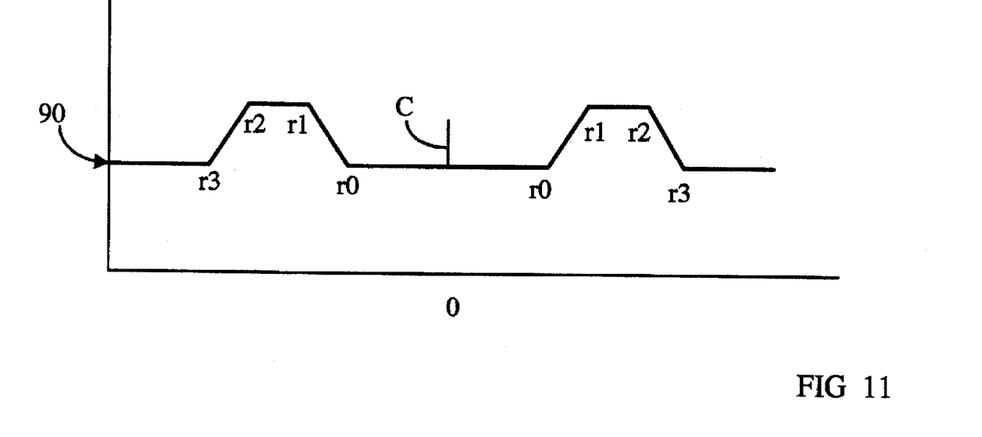
FIG. 11 is a graph of a plot of a ring cross section.
Figure 12A:
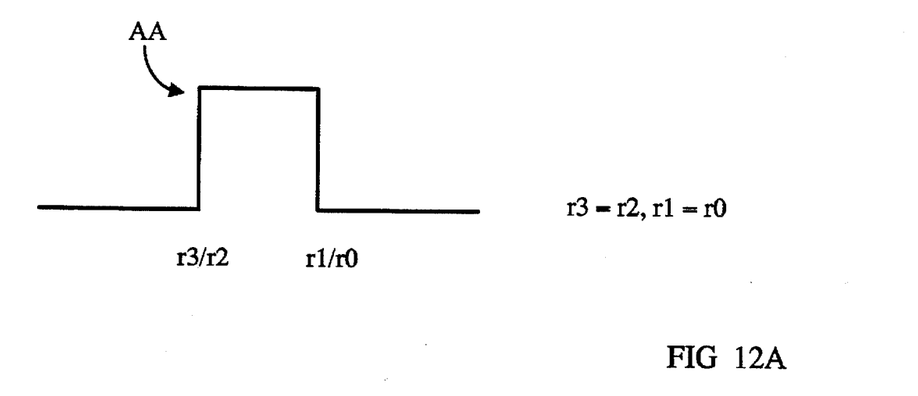
FIG. 12a shows a graph of a plot of a ring having no variation in intensity.
Figure 12B:
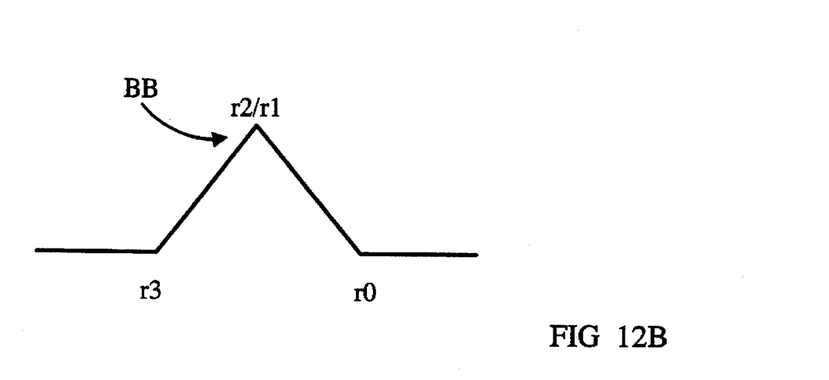
FIG. 12b shows a graph of a plot of a ring having a minimal constant intensity region.

Turning to FIG. 11, a graphical representation of a whole ring is shown, in which fringing or variation in image intensity is also depicted. In a typical bonding system, the bounds of a whole ring indentation 90, having variations in image intensity, would be profiled in graph form as the radii, r0 through r3, appearing on either side of a center 0, in FIG. 11. In FIG. 12a it can be seen that if the indentation has no variation in intensity, its bounds would be depicted as a rectangular shaped peak AA, in which r3=r2 and r1=r0. If it has minimal variation in intensity its bounds would be similar to the triangular peak BB in FIG. 12b.

Those skilled in the art will appreciate that the embodiments described above are illustrative only, and that other systems in the spirit of the teachings herein fall within the scope of the invention.

A preferred embodiment of the present invention also includes a camera or other device for generating a video or image signal. The video signal generated by the camera is typically converted from analog to digital by techniques well known in the art and sent to an image memory, such as a frame grabber, or similar device for storing images. A vision processor system, which includes a computer central processing chip, and input/output capabilities, is coupled to the image memory and is used to perform image processing and analysis according to the present invention. Portions of image processing and analysis are accomplished by software programs controlling the vision processor system, or, as will be evident to one skilled in the art, can be controlled by equivalent circuits created in special integrated circuit chips. The results of image processing and analysis are transmitted electronically to the apparatus or system requiring the machine vision results. Alternatively, the machine vision function can be incorporated within and work as part of a larger system.

What is claimed is:

1. In a machine vision system having a means for optically sensing objects and digitizing and analyzing images of said objects, a method for automatically detecting an indentation formed by a bonding device in a wire bonded to a lead:
   a. constructing a grey level model of an idealized indentation including parameters indicating threshold values for location, wire angle and acceptable image correlation;
   b. acquiring a digitized image of said lead;
   c. conducting a normalized correlation search of said digitized image using said model;
   d. comparing results of said normalized correlation search to said parameters;
   e. passing results signals to a decision-making mechanism.

2. In a machine vision system having a means for optically sensing objects and digitizing and analyzing images of said objects, an apparatus for automatically detecting an indentation formed by a bonding device in a wire bonded to a lead comprising:
   a. means for constructing a grey level model of an idealized indentation including parameters indicating threshold values for location, wire angle and acceptable image correlation;
   b. means for acquiring a digitized image of said lead;

c. means for conducting a normalized correlation search of said digitized image using said model;

d. means for comparing results of said normalized correlation search to said parameters;

e. means for passing results signals to a decision-making mechanism.

* * * * *